United States Patent [19]
Di Zenzo et al.

[11] Patent Number: 5,745,673
[45] Date of Patent: Apr. 28, 1998

[54] MEMORY ARCHITECTURE FOR SOLID STATE DISCS

[75] Inventors: Maurizio Di Zenzo, Roccapriora; Rodolfo Grimani, Rieti, both of Italy

[73] Assignee: Texas Instruments Incorporated, Dallas, Tex.

[21] Appl. No.: 531,984

[22] Filed: Sep. 21, 1995

[51] Int. Cl.⁶ .................................. G06F 11/00; G06C 7/00
[52] U.S. Cl. ..................... 395/182.05; 395/412; 371/40.1; 365/201
[58] Field of Search .................... 371/40.1, 40.2, 371/37.3; 395/182.04, 182.05, 445; 365/200, 230.01, 201

[56] References Cited

U.S. PATENT DOCUMENTS

| | | | |
|---|---|---|---|
| 4,463,450 | 7/1984 | Haeusele | 365/200 |
| 4,694,454 | 9/1987 | Matsuura | 395/182.04 |
| 4,862,416 | 8/1989 | Takeuchi | 365/200 X |
| 4,899,067 | 2/1990 | So et al. | 307/465 |
| 5,124,949 | 6/1992 | Morigami | 365/210 |
| 5,199,033 | 3/1993 | McGeoch et al. | 395/182.05 |
| 5,307,356 | 4/1994 | Fifield | 371/40.1 |
| 5,315,552 | 5/1994 | Yoneda | 365/200 |
| 5,359,563 | 10/1994 | Brendin et al. | 365/200 |
| 5,422,850 | 6/1995 | Sukegawa et al. | 365/200 |

Primary Examiner—Ly Hua
Attorney, Agent, or Firm—William B. Kempler; Richard L. Donaldson

[57] ABSTRACT

A solid state disc (SSD) Memory comprising the following functional blocks: a memory block (DATA ARRAY) wherein check data bytes are written; a transcoder memory block (SCRAMBLE RAM) which contains the table enabling the reallocation of the data matrix addresses, wherein redundant rows are included; a block (SCRAM DEC) for decoding the addresses of the decoder table; a logic block (FUSE LOGIC) to enable a step to be executed to locate any non-useable row and to substitute said redundant rows therefor; an error correction code (ECC) block for implementing the error correction algorithm; an input buffer block (LOGICAL ROW ADDRESS BUFFER) for storing the row addresses coming from the external bus; a non-volatile memory block, programmed during the test stage and available to a possible processor for handling the contents of the transcoder memory (SCRAMBLE RAM); a word counter block (WORD COUNTER) that is driven from the external clock signal (clock) and counts the number of the addressed words and generates the word addresses; two input and output buffer blocks (DATA IN/OUT) for the data to be written in or read out; a multiplexer block (MUX) by which the data stream is driven to the data memory (DATA ARRAY) or to the transcoder memory (SCRAMBLE RAM).

14 Claims, 1 Drawing Sheet

MEMORY ARCHITECTURE FOR SOLID STATE DISCS

BACKGROUND OF THE INVENTION

This invention broadly relates to the memory field and more particularly concerns a novel memory architecture adapted for manufacturing solid state discs.

Among the presently available techniques for mass storage of data of increasing importance are solid state discs (SSD). These are structures in which commercial memory chips are used, usually intended to operate as resident memories and arranged so as to act as magnetic discs.

It has been found that the utilization of the presently available commercial memories (typically DRAM memories) produces an increase in the weight of the global structure of the solid state disc, and the need has been identified that a specific memory architecture needs to be designed in order that an optimum operation of these systems be achieved.

It should also be noted that the solid state discs should be compatible with the presently available mass storage systems, and, therefore, they should be structured as 512 byte blocks.

In the state of the art, the memory devices have been considered as devices to be used as central nodes of systems which are directly interfaced with a microprocessor. This means that both the functionality and the electrical and logical interface have been designed so as to optimize communication between the central processing unit (CPU) and the cells of the memory device itself. As soon as other applications and other architectures are considered the interface type and the functionality type may not be the optimum ones.

SUMMARY OF THE INVENTION

Based upon the experimental work carried out in the field of the solid state discs, it is a broad object of this invention to design an optimum architecture, such that the whole design of a mass memory system based upon silicon memories is simplified.

From this view point and also in efforts to ensure costs are minimized, it is important that the memory obtained should have an optimum grade of fault tolerance and a special relevance has been assigned in the present invention to incorporating suitable error correction mechanisms into the same memory device. The aim is to design the arrangement in such a way that the generic external user requesting data from the memory should deal with the memory architecture only at an optimum time, for example at the initialisation time. In addition the user should not need to deal with it at each data extraction step. This means that, when the user requests a data block stored at a nominal address xxx, the memory itself retrieves the requested data block, even if it is not stored at the effective address xxx, but it is stored at a different address where it was physically possible to insert it.

It is an object of this invention to build-up a map of failing bits at multi-probe level, i.e. before the memory is assembled. In addition the map of failing bits is permanently incorporated within the memory and remains therewith until it is found necessary or convenient to modify it. An advantage of this approach is that such a memory utilized for mass storage applications is not tested as a computer memory, but is tested by using specific algorithms and by carrying out a specific test program.

According to one aspect of the invention, there is provided a Solid State Disc Memory comprising a first memory block in which data bytes are written; a second memory block which contains a table enabling the reallocation of the data matrix addresses, wherein redundant rows are included, a block for decoding the addresses of the decoder table, a logic block to enable a step to be executed to locate any non-useable row and to substitute said redundant rows therefor, an error correction code block for implementing the error correction algorithm, an input buffer block for storing the row addresses coming from the external bus, a non-volatile memory block, programmed during the test stage and available to a possible external processor for handling the content of the transcoder memory, and a word counter block that is driven from the external clock signal and counts the number of the addressed words and generates the word addresses, two input and output buffer blocks for the data to be written in or read out, and a multiplexer block by which the data stream is driven to the data memory or to the transcoder memory.

The memory according to this invention, compared to a conventional memory, is structured in such a manner that the cell matrix includes not only locations for storing data, but also locations for storing an error correction code. This means that all information is contained within the chip and there is no need for any external circuitry be employed. In this way, the information exchange with the external world is enhanced.

The chips used can be effected by faults of various kinds and, as a consequence, errors are likely to occur in the bits stored therein. This raises the need for a mechanism adapted to implement an error correction code (ECC) algorithm be included within the solid state disc (SSD) itself. When use of an error correction code of the Reed Salomon Code type is considered, a redundancy of 12.5% is achieved and consequently a memory capacity larger than the conventional 512 bytes per sector is needed: more precisely, 64 test bytes are to be added to each block of 512 data bytes.

The error correction code may implement an algorithm for correcting the data stored in the memory, thereby eliminating the harmful effects of the memory faults. Of course, the error correction code may be affected by a functional limit and non-corrigible errors may remain.

Aiming at solving the problem of the non-corrigible errors, the architecture according to the invention provides for a redundancy area intended to replace any "too faulty" regions. As above mentioned, the adopted approach produces a faulty bit map that will enable the error containing rows to be replaced. In addition the ECC algorithm can be automatically generated.

Should the memory array be manufactured by means of volatile techniques, the chip according to this invention may include an optional additional circuitry designed for executing internal refresh operations.

The chip according to this invention is adapted to store the data and the error correction code;

to rearrange the cell matrix when there are rows including faulty cells;

to implement the error correction algorithm, and to generate the refresh operations for volatile memories, to permit external access by means of suitable buffers.

Further details, particulars and advantages of this invention will become apparent from the following description by referring to the annexed drawings, wherein the preferred embodiments are shown by way of illustration.

IN THE DRAWINGS

In the drawings, the schematic view shown in FIG. 1 represents the block design of the memory according to this invention.

DETAILED DESCRIPTION

Figure 1:
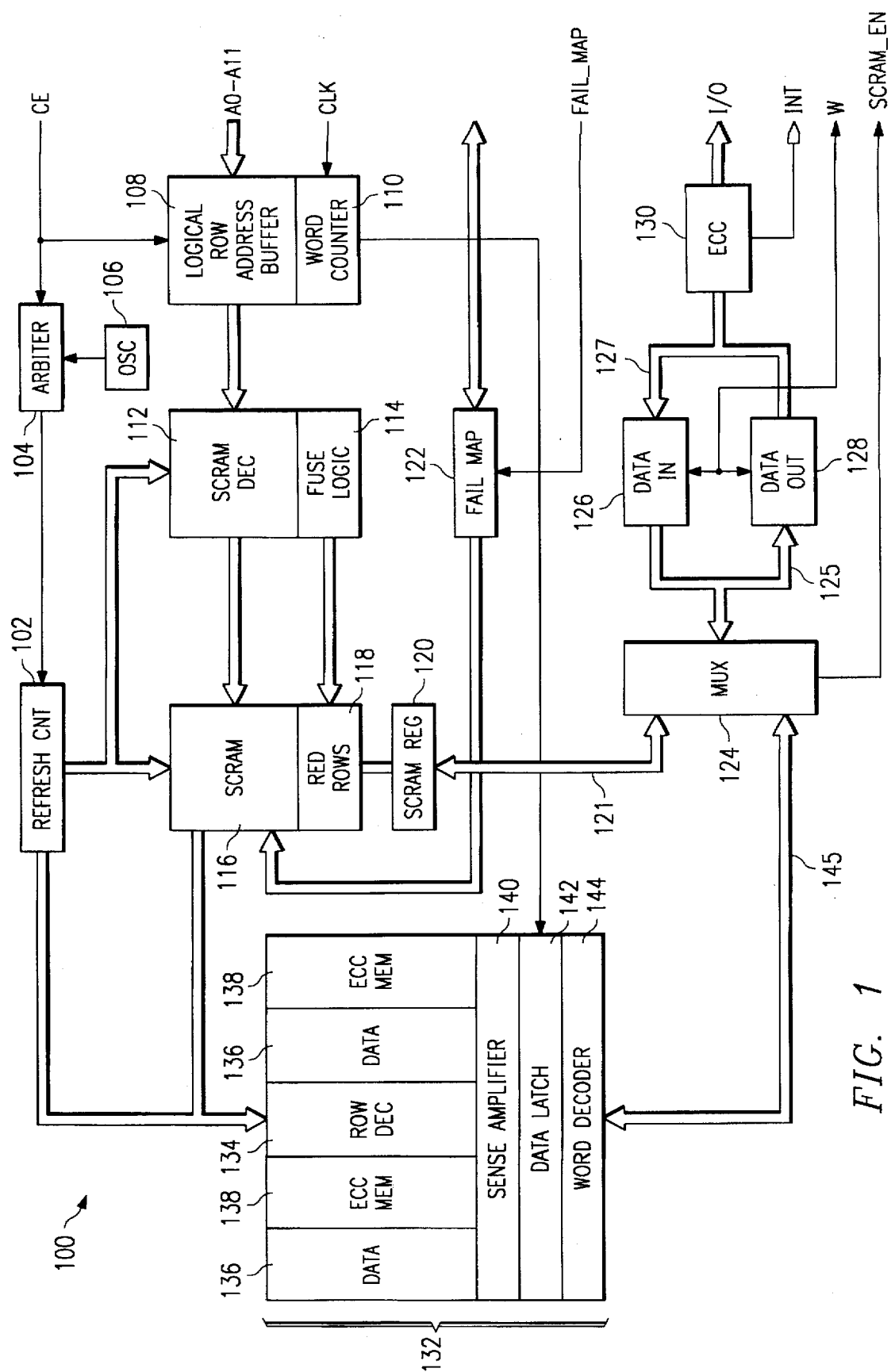

Referring to FIG. 1, a circuit for implementing an embodiment of the present invention is generally shown as 100. In FIG. 100, a 12 bit address A0–A11 is applied to a logical address buffer 108 to address the solid state disc. In order to emulate a disc, in which a sector of, for example, 512 bytes are accessed with a single address, a word counter 110 is provided to clockout 512 bytes of data under the control of an external clock CLK. The output of the logical row address buffer 108 is applied to a SCRAMBLE RAM (SCRAM) 116 via scram decoder 112. The SCRAM 116 allows reallocation of the data matrix addresses due to defects in the data memory of the solid state disc. The address applied to the logical row address buffer 108 is translated in the SCRAM to an address for the data memory 132. In this manner, defects which may be a defective row, for example, can be accommodated by skipping the defective row and mapping the address to the next operable row. In view of the fact that the SCRAM does not decode the address to provide a direct access to the data, but translates it into a second address, it is called a transcoder memory. The SCRAM decoder 112 decodes the address applied in the logical row address buffer to select a location in the SCRAM 116 which in turn contains the location of the desired address in the data memory 132.

Because the SCRAM is used as part of the addressing system, no errors in the SCRAM can be tolerated. Therefore, the SCRAM 116 is provided with redundant rows 118 which can be used to replace defective rows in the SCRAM 116. The replacement of these rows is controlled by the fuse logic 114 in the SCRAM decoder 112. A fuse logic is set at the time of testing of the device to substitute redundant rows or defective rows, in a known manner.

The output of the SCRAM 116 is an address for the data memory 132 which is applied to the row decoder 134. The data memory preferably has two portions; a data portion 136 and a error correction code memory portion 138. In one form of the invention, the data portion contains 512 bytes and the error correction code memory 138 portion contains 64 bytes. The error correction code can be, for example, a Reed Salomon Code which are well known in the art.

In a preferred embodiment, the memory is configured such that each of the rows is organized as having 512 bytes of data and 64 bytes of ECC data. The memory would have 500 rows so as to obtain a 15M bit system. As thus configured, the memory would be able to operate in a "page mode" operation in which access of a single row permits access to all 576 bytes. The word counter 110 operated by the clock signal CLK would thus enable the appropriate bit positions along the row to read out the data to the I/O bus, which may be, for example, a 16 bit bi-directional, data bus. The data would be sensed by sense amplifier 140 and latched to the data latch 142 and decoded by a word decoder 144, in a conventional manner. The data will then flow through the bus 145 between the data memory 132 to multiplexer 124 which will pass the data along an internal bus 125 to the output circuit 128 which in turn will pass the data via an internal bus 127 to the error correction code circuitry 130. The data 136 and the ECC data 138 will be utilized by the ECC circuit 130 to perform error correction of information stored in the data memory 132. If the data correction is satisfactorily performed, the data will be supplied on the I/O bus. If the error correction cannot be satisfactorily performed, an interrupt signal will be provided on line INT to the microprocessor (not shown).

When data is written into memory, the data is supplied on the bi-directional bus I/O into the ECC circuit 130 which performs the calculations necessary to generate the data that will be stored in the ECC memory 138. This data is fed along the internal bus 127 to data input circuit 126, and from there here via internal bus 125 to the MUX 124. From the MUX 124 the data is supplied via the bi-directional internal bus 145 to the data memory 132. The data input circuit 126 and the data output circuit 128 are under control of the signal W so that data can either written into or read from the memory.

During testing of the system, the signal SCRAM_EN signal is utilized to control the operation of the multiplexer to allow direct access to the SCRAM 116 via the I/O bus. This enables the SCRAM to be tested by feeding data through the multiplexer 124 along a bi-directional internal bus 121 to the SCRAM register 120 and then into the SCRAM. Data would be loaded into the SCRAM, and the SCRAM would be tested to determine if there are defective positions within the memory. If there are defective portions of the memory, the fuse logic 114 is programmed to substitute one of the redundant rows 118 for a row which contains a defect. This is because no defects can be tolerated within SCRAM, as this would result in erroneous translation of the address supplied to logical row address buffer 108. During normal operation of the memory, the signal SCRAM_EN causes the multiplexer to only operate to send data to or receive data from the data memory 132 and no data is sent to or from the SCRAM.

During the testing stage, the data memory 132 is tested and those rows which have failures are detected. It is necessary to store this information in a non-volatile manner so that the information can be recovered each time the system is initialized so that the memory test need not be run again. This is accomplished by storing this information in the fail map memory 122 by means of a bi-directional bus and in which would only be changed during a subsequent test of the memory. At the initial evaluation of the system, the microprocessor would utilize the signal fail_map to cause the contents of the fail map memory 122 to be used in setting up the translated addresses in the SCRAM 116 so that defective rows of the main memory 132 will be bypassed.

The SCRAM 116 and data memory 132 can be made from memory circuit such as DRAMs which require periodic refreshing, as is known to those skilled in the art. In this case, it is necessary to provide the circuits 102, 104 and 106. The CE (chip enable) signal, which also enables the logical row address buffer 108 is used to enable an arbiter circuit 104 which determines whether a refresh operation will occur or if the memory is being read. The arbiter 104 is clocked by oscillator 106 to cause the refresh counter 108 to generate row addresses to the respective memories in order to cause them to be refreshed, in a manner known in the art. The circuits are not required if static memory such as SRAMs are utilized.

Operation Mode

The blocks shown, in FIG. 1 provide for a correct operation of the memory. Some operation modes will now be analysed.

ACCESS: first of all, it is necessary that the chip be enabled: this is achieved by setting signal CE=active, subsequently the addresses should be transferred, by loading them into suitable buffers DATA IN/DATA OUT. Signal W (write/read) determines the direction of the data.

WRITE: upon applying the logic address, the transcoder memory translates it into a material address and in the mean time during the real address generation step, it provides for skipping any faulty rows. The error correction (ECC) block provides for adding the redundancy bytes loaded into the input buffer to the data and such bytes are conveyed by means of a multiplexer circuit MUX to the cell matrix wherein they are all stored in a single row. Contemporaneously the clock signal enables the word counter to count the number of the obtained addresses and consequently the transferred bytes by means of an external operation, for each input byte.

READ: upon enabling the chip by means of the CE active signal and upon switching it to a read condition by disabling signal W, the sector address is provided and the material address is generated to enable the desired row to be accessed to by means of the transcoder table. The data will reach the above said buffer circuits and will be processed by the error correction block ECC, which locates and corrects any storage errors by means of the redundant bits. Should this operation be unsuccessfully performed, it will notify the non-corrigible error status to the central processor by means of said INT signal.

The construction according to this invention will also permit a direct access to the SCRAMBLE memory, as is necessary during the diagnostic stage of the solid state disc: this operation takes places by setting signal SCRAM_EN active.

As previously mentioned, the memory according to this invention is a memory of quasi-static type; in fact, the chip automatically handles both the refresh operation of the data memory and the refresh operation of the SCRAMBLE memory. These performances are assured by the following blocks: REFRESH, by which the refresh function is effectively carried out, ARBITER, by which any conflicts between access and refresh operations are solved, and OSC, by which the synchronisation between the operations of the above two blocks is assured.

Description of Signals and Buses

CE: active low signal enabling the activation of the memory chip,

A0-1: 12 bit buses used to supply the chip with the required addresses,

CLK: this signal is enabled each time a byte arrives and, in turn, it enables the word counter to count the addressed bytes, INT: this is an interrupt signal by which the ECC block indicates the existence of a not-corrigible error, FAIL_MAP: permits access to the memory area, I/O: this is the 16 bit, bi-directional, data bus, W: low active signal that enables the data flow direction to be controlled: read/write, SCRAM: it enables the data bus to be connected either to the cell matrix or to the map memory.

Many advantages are connected with using the memory as, shown in FIG. 1. First of all, it enables the control operations as well as the control module to be simplified. In particular the interface circuit between the microprocessor and the memories of the solid state disc SSD is simplified. The control module, will then perform only the function to by-pass the addresses by making them compatible with the memory as carried out by the control module itself. This reduces both the physical size of the control module itself and the complexity of the algorithm of the logic connection between data and control byte.

The memory according to this invention, (ASM: Application Specific Memory) guarantees a noticeable advantage during the manufacturing stage, in particular during the test stage of the memory chips. This is in comparison to DRAM memories. A single pass test is sufficient. Since the control bytes are all sequentially stored in a single row, the addressing operation can only be effected in the so-called "page mode" and an immediate logic connection exists between the memory area allotted to the data and the memory area allotted to the check bytes. In view of this, the two different kinds of analysis of the DRAM memory faults as presently needed would be simplified and unified into a single test operation, with improvements in terms of production rates.

Furthermore the restriction to a single faulty byte per block no longer exists, in contradiction to conventional memories. In fact, since all 576 bytes are consecutive, it will be sufficient to check that the maximum number of faulty bytes within the string is less than or equal to the maximum allowable fault rate. In conventional DRAM memories, since it is not possible to logically connect the data and ECC memory areas, it is necessary to adopt more restrictive rules so as to avoid that the sum of the defects of the two concerned areas be greater than the correction capability of the selected code.

Lastly, the production rate of ASM memories is less expensive than that of DRAM memories. The number of the manufacturing stages is decreased. By analysing the data concerning the effects upon the chip ageing errors, it can be noted that all kinds of errors occurring therein do not raise any problem to the solid state disc (SSD) manufactured with built-in ("on-chip") ECC. This results in the fact that the test procedure of this new memory will no longer need the "burn-in" stage and the repetition of the whole test procedure at room temperature.

The preferred embodiment of this invention has been described and a number of variations have been suggested hereinbefore, but it should expressly be understood that those skilled in the art can make other variations, changes and modifications in the details and in the construction particulars, without departing from the scope of this invention.

We claim:

1. A memory comprising:
   a first memory block in which data bytes are stored;
   a second memory block which contains a transcoder table enabling reallocation of data addresses, wherein redundant rows are included;
   a block for decoding the addresses of the transcoder table;
   a fuse logic block to enable a step to be executed to locate non-useable rows and to substitute said redundant rows therefor;
   an error correction code block for implementing an error correction algorithm;
   a non-volatile memory fail map block, programmed during a test stage for storing addresses of non-useable rows in said first memory block for determining content of the transcoder table; and
   a word counter block that is driven from a clock signal and counts the number of the addressed words and generates the word addresses.

2. The memory according to claim 1, further comprising;
   an input logical row address buffer block for storing the row addresses coming from an external bus;
   two input and output buffer blocks for the data to be written in or read out; and
   a multiplexer block by which a data stream is driven to the first memory block or to the second memory block.

3. The memory according to claim 1, further including:
   a refresh counter block to generate the addresses of both the first memory block and the second memory block;
   an arbiter block that, by acting upon the refresh counter, controls the refresh operations and solves the conflict between the memory access and the memory refresh operations; and a local oscillator block that provides for timing the arbiter block.

4. The memory according to claim 1, wherein the following signals operate the memory:

CE: active low signal enabling the activation of a memory chip;

CLK: a clocking signal which is enabled each time a byte arrives and in turn enables the word counter to count the addressed bytes;

INT: an interrupt signal by which the error correction code (ECC) block indicates the existence of a non-corrigible error;

FAIL.MAP: a signal, controlling said non-volatile memory block;

W: a low active signal that enables data flow direction to be controlled, read/write;

SCRAM_EN: a signal which enables a data bus to be connected either to the first or to the second memory.

5. The memory according claim 1, wherein the following buses are connected to the memory:

A0–A11: 12 bit buses used to supply a chip with the required 12 addresses,

I/O: a 16 bit, bi-directional, data bus, a further bus being provided for an external processor to access to a FAIL MAP block.

6. The memory according to claim 1, wherein the first memory block is a data array.

7. The memory according to claim 1, wherein the second memory block is a transcoder memory.

8. The memory according to claim 1 in the form of a Solid State Disc Memory.

9. A memory comprising:

a first memory block in which data bytes are stored wherein redundant rows are included;

a second memory block which contains a transcoder table enabling reallocation of data addresses;

a block for decoding the addresses of the transcoder table;

a non-volatile fail map memory block, programmed during a test stage for storing addresses of non-useable rows in said first memory block for determining content of the transcoder table memory; and a word counter block that is driven from a clock signal and counts the number of the addressed words and generates the word addresses.

10. The memory according to claim 9, further comprising;

an error correction code block for implementing an error correction algorithm;

an input logical row address buffer block for storing the row addresses coming from an external bus;

two input and output buffer blocks for the data to be written in or read out; and a multiplexer block by which a data stream is driven to the first memory block or to the second memory block.

11. The memory according to claim 9, further including:

a refresh counter block to generate the addresses of both the first memory block and the second memory block;

an arbiter block that, by acting upon the refresh counter, controls the refresh operations and solves the conflict between the memory access and the memory refresh operations; and a local oscillator block that provides for timing the arbiter block.

12. The memory according to claim 9, wherein the first memory block is a data array.

13. The memory according to claim 9, wherein the second memory is a transcoder memory.

14. The memory according to claim 9 in the form of a Solid State Disc Memory.

* * * * *